US011879075B2

United States Patent
Kim et al.

(10) Patent No.: US 11,879,075 B2
(45) Date of Patent: Jan. 23, 2024

(54) RESIN COMPOSITION FOR BONDING SEMICONDUCTORS, ADHESIVE FILM FOR SEMICONDUCTOR USING THE SAME, DICING DIE BONDING FILM, AND METHOD FOR DICING SEMICONDUCTOR WAFER

(71) Applicant: LG CHEM, LTD., Seoul (KR)

(72) Inventors: Wanjung Kim, Daejeon (KR); Jong Min Jang, Daejeon (KR); Byung Ju Choi, Daejeon (KR); Kwang Joo Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 686 days.

(21) Appl. No.: 17/040,180

(22) PCT Filed: Nov. 1, 2019

(86) PCT No.: PCT/KR2019/014712
§ 371 (c)(1),
(2) Date: Sep. 22, 2020

(87) PCT Pub. No.: WO2020/101236
PCT Pub. Date: May 22, 2020

(65) Prior Publication Data
US 2021/0009867 A1 Jan. 14, 2021

(30) Foreign Application Priority Data

Nov. 14, 2018 (KR) .................. 10-2018-0139900
Oct. 24, 2019 (KR) .................. 10-2019-0133049

(51) Int. Cl.
*C09J 133/08* (2006.01)
*C08K 3/22* (2006.01)
*C08K 5/5419* (2006.01)
*C08K 9/06* (2006.01)
*C09J 163/04* (2006.01)
*H01L 21/683* (2006.01)
*H01L 21/78* (2006.01)

(52) U.S. Cl.
CPC .............. *C09J 133/08* (2013.01); *C08K 3/22* (2013.01); *C08K 5/5419* (2013.01); *C08K 9/06* (2013.01); *C09J 163/04* (2013.01); *H01L 21/683* (2013.01); *H01L 21/78* (2013.01); *C08K 2003/2227* (2013.01)

(58) Field of Classification Search
None
See application file for complete search history.

(56) References Cited

U.S. PATENT DOCUMENTS

| 9,296,925 B2 | 3/2016 | Wakayama et al. |
| 2011/0037180 A1* | 2/2011 | Yoo ................... C08K 5/13 |
| | | 257/E23.003 |
| 2011/0159294 A1 | 6/2011 | Song et al. |
| 2011/0160339 A1 | 6/2011 | Jeong et al. |
| 2012/0012999 A1 | 1/2012 | Honda et al. |
| 2015/0060889 A1 | 3/2015 | Makihara et al. |
| 2019/0043748 A1 | 2/2019 | Kim et al. |

FOREIGN PATENT DOCUMENTS

| CN | 100391995 C | 6/2008 |
| CN | 104245874 A | 12/2014 |
| CN | 108174606 A | 6/2018 |
| EP | 1595919 A1 | 11/2005 |
| JP | 2011-026374 A | 2/2011 |
| JP | 2016-104832 A | 6/2016 |
| JP | 6239500 B2 | 11/2017 |
| JP | 6247204 B2 | 12/2017 |
| JP | 2018-148124 A | 9/2018 |
| KR | 10-1023241 B1 | 3/2011 |
| KR | 10-1033045 B1 | 5/2011 |
| KR | 10-2014-0142674 A | 12/2014 |
| KR | 10-2015-0003287 A | 1/2015 |
| KR | 10-2015-0037829 A | 4/2015 |
| KR | 10-1704891 B1 | 2/2017 |
| KR | 10-2018-0037797 A | 4/2018 |
| WO | 2018-066851 A1 | 4/2018 |

OTHER PUBLICATIONS

International Search Report issued for International Application No. PCT/KR2019/014712 dated Feb. 21, 2020, 2 pages.
Extended European Search Report issued for European Patent Application No. 19885177.6 dated Jun. 1, 2021, 6 pages.

* cited by examiner

*Primary Examiner* — Robert T Butcher
(74) *Attorney, Agent, or Firm* — ROTHWELL, FIGG, ERNST & MANBECK, P.C.

(57) ABSTRACT

The present invention relates to a resin composition for bonding semiconductors including two types of curing catalyst mixtures together with a heat dissipation filler in which a specific functional group is introduced onto the surface, an adhesive film for semiconductor produced therefrom, a dicing die bonding film and a method for dicing a semiconductor wafer.

16 Claims, No Drawings

RESIN COMPOSITION FOR BONDING SEMICONDUCTORS, ADHESIVE FILM FOR SEMICONDUCTOR USING THE SAME, DICING DIE BONDING FILM, AND METHOD FOR DICING SEMICONDUCTOR WAFER

CROSS-REFERENCE TO RELATED APPLICATION(S)

This application is a 35 U.S.C. 371 National Phase Entry Application from PCT/KR2019/014712 filed on Nov. 1, 2019, designating the United States, which claims priority to or the benefit of Korean Patent Application No. 10-2018-0139900 filed with the Korean Intellectual Property Office on Nov. 14, 2018 and Korean Patent Application No. 10-2019-0133049 filed with the Korean Intellectual Property Office on Oct. 24, 2019, the disclosures of which are incorporated herein by reference in their entirety.

The present invention relates to a resin composition for bonding semiconductors having excellent storage stability at room temperature, and excellent embedding property and adhesive strength of semiconductors, and capable of implementing improved thermal conduction characteristics, an adhesive film for semiconductor obtained therefrom, a dicing die bonding film using the same and a method for dicing a semiconductor wafer.

BACKGROUND OF THE INVENTION

Recently, as the tendency toward miniaturization, high functionalization, and large capacity of electronic equipment has been expanding and the need for densification and high integration of a semiconductor package has rapidly increased, the size of semiconductor chips has been becoming larger and larger. In terms of improvement of integration degree, the stack packaging method for stacking chips in multiple stages has gradually increased.

Depending on the use of the multi-stage semiconductor stack package, the thickness of the chip becomes thinner and the degree of integration of the circuit becomes higher. However, the modulus of the chip itself is lowered, causing problems in the manufacturing process and the reliability of a final product. In order to solve these problems, attempts have been made to strengthen the physical properties of the adhesive used in the semiconductor packaging process.

In addition, as a semiconductor chip has recently become thinner, there is a problem in that the chip is damaged in the existing blade cutting process thus lowering a yield, and in order to overcome this, a preparation process of firstly cutting a semiconductor chip with a blade and then polishing it has been suggested. An adhesive is not cut in such preparation process. Thus, the adhesive is cut using a laser and then cut through an expanding process of the substrate film at a low temperature. Further, recently, in order to protect the circuit on the chip, a process of cutting the adhesive through the low temperature expansion process and the heat shrinking process is applied without using a laser.

Meanwhile, with a recent tendency of electronic equipment and electronic components to become light, thin, short, and small, the degree of integration of electrical devices is becoming high, and the heating value of electrical devices that are operated with electrical energy is largely increasing. Thereby, there is increasing demand for improvement in the heat dissipation property for effectively dispersing heat generated in electrical equipment and dissipating it.

However, in the case of heat dissipation adhesive materials that have been developed in the past, as the reaction with the heat dissipation adhesive material itself or dicing tape spontaneously occurs at room temperature storage due to the strong reactivity, there is a limit in that the viscosity of the heat dissipation adhesive material increases and the adhesive strength with the dicing tape increases.

When the adhesive strength between the heat dissipation adhesive material and the dicing tape increases, pick-up is not performed in the process of picking up the chip after semiconductor wafer mounting and UV irradiation, and thus it is impossible to proceed a subsequent process of semiconductor.

When the viscosity of the heat dissipation adhesive material increases, there was also a problem that in the case of heat dissipation FOD (Fill Over Die), important embedding characteristics were remarkably lowered while the wettability of semiconductor wafers was lowered.

Therefore, there is a need to develop a resin composition for bonding semiconductors that enables the implementation of storage stability at room temperature by ensuring the optimal level of viscosity and the adhesive strength, and can implement excellent thermal conduction characteristics.

BRIEF SUMMARY OF THE INVENTION

The present invention provides a resin composition for bonding semiconductors having excellent storage stability at room temperature, and excellent embedding property and adhesive strength of semiconductors, and capable of implementing improved thermal conduction characteristics.

The present invention also provides an adhesive film for semiconductor, a dicing die bonding film using the same and a method for dicing a semiconductor wafer, using the aforementioned resin composition for bonding semiconductors.

One aspect of the present invention provides a resin composition for bonding semiconductors including: a binder resin containing a (meth)acrylate-based resin and an epoxy resin; a curing agent; a heat dissipation filler in which a functional group represented by the following Chemical Formula 1 is introduced onto the surface thereof; and a curing catalyst containing an imidazole-based compound and an organic acid compound.

[Chemical Formula 1]

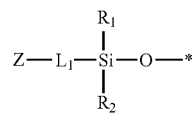

wherein, in Chemical Formula 1, Z is one of an aryl having 6 to 30 carbon atoms, epoxy, (meth)acryloyloxy, an alkenyl having 2 to 40 carbon atoms, an alkenylaryl having 8 to 40 carbon atoms, or an alkyl having 1 to 20 carbon atoms, $L_1$ is one of a direct bond, an alkylene having 1 to 20 carbon atoms, an alkyleneoxy having 1 to 20 carbon atoms, or an alkyleneoxyalkylene having 1 to 20 carbon atoms, and $R_1$ and $R_2$ are the same as or different from each other, and are each independently one of hydrogen, an alkyl having 1 to 20 carbon atoms, an alkoxy having 1 to 20 carbon atoms, a hydroxy group, a direct bond, or oxy.

Another aspect of the present invention provides an adhesive film for semiconductor including: a polymer substrate containing a (meth)acrylate-based resin, a curing agent and an epoxy resin; a heat dissipation filler in which a functional group represented by Chemical Formula 1 is introduced onto the surface thereof; and a curing catalyst containing an imidazole-based compound and an organic acid compound, wherein the heat dissipation filler and the curing catalyst are dispersed in the polymer substrate.

Another aspect of the present invention provides a dicing die bonding film including: a substrate film; a tacky layer formed on the substrate film; and an adhesive layer formed on the tacky layer and including the adhesive film for a semiconductor.

Yet another aspect of the present invention provides a method for dicing a semiconductor wafer including the steps of: pre-treating of completely cutting or partially treating to enable cut a semiconductor wafer including the dicing die bonding film and a wafer laminated on at least one side of the dicing die bonding film; and irradiating ultraviolet light to the substrate film of the pre-treated semiconductor wafer and picking up individual chips separated by the cutting of the semiconductor.

DETAILED DESCRIPTION OF THE INVENTION

Hereinafter, a resin composition for bonding semiconductors, and an adhesive film for semiconductor, a dicing die bonding film, and a method for dicing a semiconductor wafer using the same according to specific embodiments of the present invention will be described in more detail.

Unless explicitly stated otherwise, the terminology used herein may be defined as follows.

As used herein, the term "(meth)acrylic" means either acrylic or methacrylic.

Throughout the specification, when one part "includes" one constituent element, unless otherwise specifically described, this does not mean that another constituent element is excluded, but means that another constituent element may be further included.

In the present specification, examples of the substituents are described below, but are not limited thereto.

As used herein, the term "substituted" means that other functional groups instead of a hydrogen atom in the compound are bonded, and a position to be substituted is not limited as long as the position is a position at which the hydrogen atom is substituted, that is, a position at which the substituent can be substituted, and when two or more are substituted, the two or more substituents may be the same as or different from each other.

As used herein, the term "substituted or unsubstituted" means being unsubstituted or substituted with one or more substituents selected from the group consisting of deuterium; a halogen group; a cyano group; a nitro group; a hydroxyl group; a carbonyl group; an ester group: an imide group; an amide group; a primary amino group; a carboxy group; a sulfonic acid group; a sulfonamide group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an arakyl group; an arakenyl group; analkylaryl group; an akoxysilylakyl group an arylphosphine group: or a heterocyclic group containing at least one of N, O, and S atoms, or being unsubstituted or substituted with a substituent to which two or more substituents are linked among the substituents exemplified above. For example, "the substituent to which two or more substituents are linked" may be a biphenyl group. That is, the biphenyl group may also be an aryl group, and may be interpreted as a substituent to which two phenyl groups are linked.

As used herein, the notation

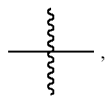

or ⁎ means a bond linked to another substituent group, and a direct bond means the case where no other atoms exist in the parts represented as L.

In the present specification, the alkyl group is a monovalent functional group derived from an alkane, and may be a straight-chain or a branched-chain. The number of carbon atoms of the straight chain alkyl group is not particularly limited, but is preferably 1 to 20. Also, the number of carbon atoms of the branched chain alkyl group is 3 to 20. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, iso-pentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, 2,6-dimethylheptane-4-yl and the like, but are not limited thereto. The alkyl group may be substituted or unsubstituted, and when substituted, examples of the substituent are the same as those described above.

In the present specification, the alkoxy group is a functional group to which the aforementioned alkyl group is bonded to one end of an ether group (—O—), and the description of the alkyl group as defined above can be applied except that these are functional groups bonded to an ether group (—O—). The alkoxy group can be, for example, a straight chain, a branched chain or a cyclic chain. The number of carbon atoms of an alkoxy group is not particularly limited, but is preferably 1 to 20. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-diethylbutyloxy, 2-ethylbutyloxy, n-octyloxy, n-nonyloxy, n-decyloxy, cycloheptoxy, benzyloxy, p-methylbenzyloxy and the like, but are not limited thereto. The alkoxy group may be substituted or unsubstituted, and when substituted, examples of the substituent are the same as those described above.

In the present specification, the aryl group is a monovalent functional group derived from an arene, and is not particularly limited, but preferably has 6 to 20 carbon atoms, and may be a monocyclic aryl group or a polycyclic aryl group. The monocyclic aryl group may include, but not limited to, a phenyl group, a biphenyl group, a terphenyl group, or the like. The polycyclic aryl group may include, but not limited to, a naphthyl group, an anthracenyl group, a phenanthryl group, a pyrenyl group, a perylenyl group, a chrysenyl group, a fluorenyl group or the like. The aryl group may be substituted or unsubstituted, and when substituted, examples of the substituent are the same as those described above.

In the present specification, the alkenyl group is a monovalent functional group derived from an alkene, and may be a straight chain or branched chain, and the number of carbon atoms thereof is not particularly limited, but is preferably 2 to 40. According to one embodiment, the number of carbon atoms of the alkenyl group is 2 to 20. According to another embodiment, the number of carbon atoms of the alkenyl group is 2 to 10. According to still another embodiment, the number of carbon atoms of the alkenyl group is 2 to 6. Specific examples thereof include, but not limited to, vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like. The alkenyl group may be substituted or unsubstituted, and when substituted, examples of the substituent are the same as those described above.

In the present specification, the alkylene group is a bivalent functional group derived from an alkane, and the description of the alkyl group as defined above can be applied except that these are bivalent functional groups. The alkylene group may be a straight chain or a branched chain, examples of which include a methylene group, an ethylene group, a propylene group, an isobutylene group, a sec-butylene group, a tert-butylene group, a pentylene group, a hexylene group, and the like. The alkylene group may be substituted or unsubstituted, and when substituted, examples of the substituent are the same as those described above.

In the present specification, the alkyleneoxy group is a functional group to which an ether group (—O—) is bonded to one end of the aforementioned alkylene group, and the description of the alkylene group can be applied.

In the present specification, the alkyleneoxyalkylene group is a functional group in which an alkylene group is bonded to a terminal oxygen atom of the aforementioned alkyleneoxy group, and the description of the alkylene group and the alkyleneoxy group can be applied.

In the present specification, the alkenylaryl group is a functional group in which an alkenyl group is bonded to one end of the aforementioned aryl group, and the description of the aryl group and alkenyl group may be applied.

In the present specification, a direct bond or a single bond means being connected to a bond line win which no atoms or atomic groups exist at the corresponding position. Specifically, it means that there is no separate atom at a part represented as $L_1$ or $L_2$ in Chemical Formula.

As used herein, the weight average molecular weight refers to a weight average molecular weight in terms of polystyrene measured by GPC method. In the process of measuring the weight average molecular weight in terms of polystyrene measured by GPC method, a detector and an analytical column, such as a commonly known analysis apparatus and differential refractive index detector can be used, and commonly applied temperature conditions, solvent, and flow rate can be used. Specific examples of the measurement conditions are as follows: Waters PL-GPC220 instrument equipped with Polymer Laboratories PLgel MIX-B, 300 mm column is used, an evaluation temperature is 160° C., 1,2,4-trichlorobenzene is used as a solvent, the flow rate is 1 mL/min, a sample is prepared at a concentration of 10 mg/10 mL and then fed in an amount of 200 μL, and the value of Mw can be determined using calibration curves formed from a polystyrene standard. The molecular weight of the polystyrene standards is nine kinds of 2,000/10,000/30,000/70,000/200,000/700,000/2,000,000/4,000,000/10,000,000.

Hereinafter, embodiments of the present invention will be described in more detail.

I. Resin Composition for Bonding Semiconductors

According to one embodiment of the present invention, there can be provided a resin composition for bonding semiconductors including: a binder resin containing a (meth)acrylate-based resin and an epoxy resin; a curing agent; a heat dissipation filler in which the functional group represented by Chemical Formula 1 is introduced onto the surface thereof; and a curing catalyst containing an imidazole-based compound and an organic acid compound.

The present inventors have found through experiments that by adding a curing catalyst containing an imidazole-based compound and an organic acid compound together with a heat dissipation filler in which the functional group represented by Chemical Formula 1 is introduced onto the surface thereof as in the resin composition for bonding semiconductors of the above-mentioned embodiments, not only it is possible to increase the thermal conductivity and so improve heat dissipation characteristics, but also it is possible to suppress unnecessary adhesion or side reactions during storage at room temperature and so achieve excellent storage stability, thereby completing the present invention.

Specifically, this is because one of an aryl having 6 to 30 carbon atoms, epoxy, (meth)acryloyloxy, an alkenyl having 2 to 40 carbon atoms, an alkenylaryl having 8 to 40 carbon atoms, or an alkyl having 1 to 20 carbon atoms, which is the Z functional group introduced into the structure of Chemical Formula 1 of the heat dissipation filler, has a low level of reactivity to the extent that it does not cause unnecessary adhesion or side reactions at room temperature, compared to the amino group that has been used in existing heat radiation fillers.

In addition, by using an imidazole-based compound and an organic acid compound as the curing catalyst together with the heat dissipation filler, the imidazole-based compound acting as a curing catalyst can react with the organic acid compound to convert the imidazole-based compound into a salt form. Thus, the melting point can be improved, and the reactivity with an epoxy resin or the like can be improved by the carboxylic acid remaining after the reaction.

Further, it has been found through experiments that as a (meth) acrylate-based resin having a specific composition is applied as a binder resin, it is possible to increase the reliability of the semiconductor chip together with improved physical properties of cured products, and additionally, it is possible to not only implement improved mechanical properties together with high heat resistance and adhesive strength, but also implement excellent heat conduction characteristics.

(1) Binder Resin

The binder resin may include a (meth)acrylate-based resin and an epoxy resin.

Specifically, the (meth)acrylate-based resin may include a (meth)acrylate-based repeating unit containing an epoxy-based functional group and a (meth)acrylate-based repeating unit (BzMA) containing an aromatic functional group.

As the (meth)acrylate-based resin includes a (meth)acrylate-based repeating unit (BzMA) containing an aromatic functional group, the resin composition for bonding semiconductors can secure higher compatibility and adhesive strength between the contained components, have high elasticity, and have a relatively improved initial tensile modulus. Moreover, as the (meth)acrylate-based resin includes a (meth)acrylate-based repeating unit (BzMA) containing an aromatic functional group, the (meth)acrylate-based resin has an advantageous effect on the dispersibility of the heat dissipation filler to increase the filling degree of a filler in addition uniform filler distribution.

In addition, as the (meth)acrylate-based resin includes a (meth)acrylate-based repeating unit containing an epoxy-based functional group, the adhesive film produced from the adhesive resin composition for a semiconductor has a more uniform and rigid internal structure, and thus high impact resistance can be ensured during multistage stacking of an ultrathin wafer, and further, electrical properties after manufacture of semiconductor may be improved.

The content of the (meth)acrylate-based functional group containing an aromatic functional group in the (meth)acrylate-based resin may be 2% by weight to 40% by weight, or 3% by weight to 30% by weight, or 5% by weight to 25% by weight. If the content of the (meth)acrylate-based functional group containing an aromatic functional group in the (meth)acrylate-based resin is too low, the effect of increasing the compatibility with the epoxy resin or the phenol resin and the dispersibility of a filler may be insignificant, and the effect of lowering the hygroscopic property of the finally produced adhesive film is insignificant. If the content of the (meth)acrylate-based functional group containing an aromatic functional group in the (meth)acrylate-based resin is too high, the adhesive strength of the finally produced adhesive film for a semiconductor can be lowered.

The aromatic functional group may be an aryl group having 6 to 20 carbon atoms, or an aryakylene group including an aryl group having 6 to 20 carbon atoms and an alkylene group having 1 to 10 carbon atoms.

The (meth)acrylate-based repeating unit containing an epoxy-based functional group may include a cycloalkylmethyl(meth)acrylate repeating unit having 3 to 20 epoxy carbon atoms. The "cycloalkylmethyl having 3 to 20 epoxy carbon atoms" refers to a structure in which a cycloalkyl having 3 to 30 carbon atoms to which an epoxy group is bonded is substituted with a methyl group. Examples of a cycloalkylmethyl(meth)acrylate having 3 to epoxy carbon atoms include glycidyl(meth)acrylate or 3,4-epoxycyclohexylmethyl(meth)acrylate.

Meanwhile, the (meth)acrylate-based resin may further include at least one repeating unit selected from the group consisting of a vinyl-based repeating unit containing a reactive functional group and a (meth)acrylate-based functional group containing an alkyl group having 1 to 10 carbon atoms.

The reactive functional group may include at least one functional group selected from the group consisting of alcohols, amines, carboxylic acids, epoxides, imides, (meth) acrylates, nitriles, norbornenes, olefins, polyethylene glycols, thiols, and vinyl groups.

When the (meth)acrylate-based resin further includes at least one repeating unit selected from the group consisting of a vinyl-based repeating unit containing a reactive functional group and a (meth)acrylate-based functional group containing an alkyl group having 1 to 10 carbon atoms, the (meth)acrylate-based resin may contain 0.1 to 30% by weight, or 5 to 30% by weight, or 10 to 30% by weight, of the (meth)acrylate-based repeating unit containing the epoxy-based functional group.

The (meth)acrylate-based resin may have a glass transition temperature of −10° C. to 20° C., or −5° C. to 15° C., or 5° C. to 15° C. In addition, the (meth)acrylate-based resin may have a weight average molecular weight of 30000 g/mol to 1500000 g/mol, or 50000 g/mol to 800000 g/mol, or 50000 g/mol to 200000 g/mol. By using a (meth)acrylate-based resin having the above-described glass transition temperature and weight average molecular weight, the finally produced adhesive film may secure high adhesive strength, and it is easy to prepare the adhesive film in the form of a thin film and the like.

When the molecular weight of the (meth)acrylate-based resin is too low, the formation of the adhesive film for semiconductor is not easy and the cutting property may be deteriorated, thereby reducing the pick-up property in the package manufacturing process. When the molecular weight of the (meth)acrylate-based resin is too high, the viscosity of the adhesive film for semiconductor is increased, the high-temperature fluidity is lowered, the wafer wettability and filling embedding property are lowered, and voids remain after assembly of the package, thereby reducing the reliability.

The hydroxyl equivalent weight of the (meth)acrylate-based resin is 0.15 eq/kg or less, or 0.01 eq/kg to 0.15 eq/kg, or 0.01 eq/kg to 0.10 eq/kg, or 0.01 eq/kg to 0.05 eq/kg.

Meanwhile, the epoxy resin may serve to adjust the curing degree of the resin composition for bonding semiconductors or increase the adhesive performance thereof, or the like.

Specific examples of the epoxy resin include one or more polymer resins selected from the group consisting of a bisphenol-based epoxy resin, a bisphenol A epoxy resin, a bisphenol F epoxy resin, a cresol novolac epoxy resin, a phenol novolac epoxy resin, a tetrafunctional epoxy resin, a triphenolmethane type epoxy resin, an alkyl-triphenolmethane type epoxy resin, a naphthalene type epoxy resin, a dicyclopentadiene type epoxy resin, and a dicyclopentadiene-modified phenol type epoxy resin.

The softening point of the epoxy resin may be −50° C. to 100° C. If the softening point of the epoxy resin is too low, the adhesive strength of the resin composition for bonding semiconductors may increase and thus the pick-up property of chips after dicing can be lowered. If the softening point of the epoxy resin is too high, the fluidity at high temperature of the resin composition for bonding semiconductors may be lowered, and the adhesive strength thereof may be lowered.

In addition, the epoxy resin is preferably used by combining two or more types of epoxies having different softening points in order to impart sufficient fluidity in package assembly process.

The epoxy equivalent weight of the epoxy resin may be 100 g/eq to 300 g/eq.

(2) Curing Agent

The curing agent can include a phenol resin.

The phenol resin may have a hydroxyl equivalent weight of 80 g/eq to 400 g/eq, or a hydroxyl equivalent weight of 90 g/eq to 250 g/eq, or a hydroxyl equivalent weight of 100 g/eq to 178 g/eq, or a hydroxyl equivalent weight of 210 to 240 g/eq. As the phenol resin has the above-described hydroxyl equivalent weight range, the curing degree is increased even at a low content and thus excellent adhesion properties can be imparted.

The curing agent may include one or more compounds selected from the group consisting of an amine-based curing agent, and an acid anhydride-based curing agent. The amount of the curing agent used may be appropriately selected in consideration of the physical properties of a finally produced adhesive film. For example, the curing agent may be used in an amount of 10 parts by weight to 700 parts by weight, or 30 parts by weight to 300 parts by weight based on 100 parts by weight of the epoxy resin.

(3) Heat Dissipation Filler

The heat dissipation filler may be used in a resin composition for bonding semiconductors, and may exert a function or effect of rapidly transferring heat generated from an electric element or the like to a heat sink or the like. The heat dissipation filler may include at least one selected from the group consisting of alumina, boron nitride, aluminum nitride, silicon carbide, magnesium oxide, zinc oxide, silica, aluminum hydroxide, calcium carbonate, magnesium hydroxide, aluminum oxide, and talc.

The heat dissipating filler may have a structure in which a functional group represented by Chemical Formula 1 is introduced onto the surface thereof.

In Chemical Formula 1, Z may be one of an aryl having 6 to 30 carbon atoms, epoxy, (meth)acryloyloxy, an alkenyl having 2 to 40 carbon atoms, an alkenylaryl having 8 to 40 carbon atoms, or an alkyl having 1 to 20 carbon atoms An example of the aryl having 6 to 30 carbon atoms may be a phenyl group, or the like.

An example of the epoxy may be 3-oxirane-2-yl, or the like.

An example of the (meth)acryloyloxy may be methacryloyloxy, acryloyloxy, or the like.

An example of the alkenyl having 2 to 40 carbon atoms may be vinyl, or the like.

An example of the alkenylaryl having 8 to 40 carbon atoms may be p-styryl, or the like.

An example of the alkyl having 1 to 20 carbon atoms may be hexyl, or the like.

That is, the functional group represented by Chemical Formula 1 may include all of the functional groups represented by Chemical Formula 1-1 to the functional groups represented by Chemical Formula 1-6, depending on the type of Z.

[Chemical Formula 1-1]

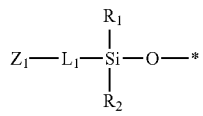

wherein, in Chemical Formula 1-1, $Z_1$ is an aryl having 6 to 30 carbon atoms, $L_1$ is one of a direct bond, an alkylene having 1 to 20 carbon atoms, an alkyleneoxy having 1 to 20 carbon atoms, or an alkyleneoxyalkylene having 1 to 20 carbon atoms, $R_1$ and $R_2$ are the same as or different from each other, and are each independently one of hydrogen, an alkyl having 1 to 20 carbon atoms, a alkoxy having 1 to 20 carbon atoms, a hydroxy group, a direct bond, or oxy. In Chemical Formula 1-1, the definition of $Z_1$ is the same as that of Z in Chemical Formula 1, and the definitions of $L_1$, $R_1$ and $R_2$ are the same as described above in Chemical Formula 1. More specifically, in Chemical Formula 1-1, $L_1$ may be an alkylene having 1 to 20 carbon atoms.

[Chemical Formula 1-2]

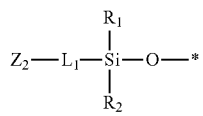

wherein, in Chemical Formula 1-2, $Z_2$ is epoxy, $L_1$ is one of a direct bond, an alkylene having 1 to 20 carbon atoms, an alkyleneoxy having 1 to 20 carbon atoms, or an alkyleneoxyalkylene having 1 to 20 carbon atoms, $R_1$ and $R_2$ are the same as or different from each other, and are each independently one of hydrogen, an alkyl having 1 to 20 carbon atoms, an alkoxy having 1 to 20 carbon atoms, a hydroxy group, a direct bond, or oxy. In Chemical Formula 1-2, the definition of $Z_2$ is the same as that of Z in Chemical Formula 1, and the definitions of $L_1$, $R_1$ and $R_2$ are the same as described above in Chemical Formula 1. More specifically, in Chemical Formula 1-2, $L_1$ may be an alkylene having 1 to 20 carbon atoms.

[Chemical Formula 1-3]

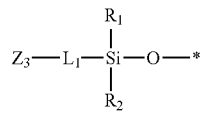

wherein, in Chemical Formula 1-3, $Z_3$ is (meth)acryloyloxy, $L_1$ is one of a direct bond, an alkylene having 1 to 20 carbon atoms, an alkyleneoxy having 1 to 20 carbon atoms, or an alkyleneoxyalkylene having 1 to 20 carbon atoms, $R_1$ and $R_2$ are the same as or different from each other, and are each independently one of hydrogen, an alkyl having 1 to carbon atoms, an alkoxy having 1 to 20 carbon atoms, a hydroxy group, a direct bond, or oxy. In Chemical Formula 1-3, the definition of $Z_3$ is the same as that of Z in Chemical Formula 1, and the definitions of $L_1$, $R_1$ and $R_2$ are the same as described above in Chemical Formula 1. More specifically, in Chemical Formula 1-3, $L_1$ may be an alkylene having 1 to carbon atoms.

[Chemical Formula 1-4]

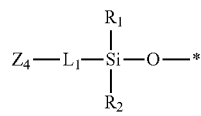

wherein, in Chemical Formula 1-4, $Z_4$ is an alkenyl having 2 to 40 carbon atoms, $L_1$ is one of a direct bond, an alkylene having 1 to 20 carbon atoms, an alkyleneoxy having 1 to carbon atoms, or an alkyleneoxyalkylene having 1 to 20 carbon atoms, $R_1$ and $R_2$ are the same as or different from each other, and are each independently one of hydrogen, an alkyl having 1 to 20 carbon atoms, an alkoxy having 1 to 20 carbon atoms, a hydroxy group, direct bond, or oxy. In Chemical Formula 1-4, the definition of $Z_4$ is the same as that of Z in Chemical Formula 1, and the definitions of $L_1$, $R_1$ and $R_2$ are the same as described above in Chemical Formula 1. More specifically, in Chemical Formula 1-4, $L_1$ may be a direct bond.

[Chemical Formula 1-5]

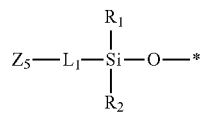

wherein, in Chemical Formula 1-5, $Z_5$ is an alkenylaryl having 8 to 40 carbon atoms, $L_1$ is one of a direct bond, an alkylene having 1 to 20 carbon atoms, an alkyleneoxy having 1 to 20 carbon atoms, or an alkyleneoxyalkylene having 1 to 20 carbon atoms, $R_1$ and $R_2$ are the same as or different from each other, and are each independently one of hydrogen, an alkyl having 1 to 20 carbon atoms, an alkoxy having 1 to 20 carbon atoms, a hydroxy group, a direct bond, or oxy. In Chemical Formula 1-5, the definition of $Z_5$ is the same as that of Z in Chemical Formula 1, and the definitions of $L_1$, $R_1$, and $R_2$ are the same as described above in Chemical Formula 1. More specifically, in Chemical Formula 1-5, $L_1$ may be a direct bond.

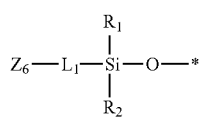

[Chemical Formula 1-6]

wherein, in Chemical Formula 1-6, $Z_6$ is an alkyl having 1 to 20 carbon atoms, $L_1$ is one of a direct bond, an alkylene having 1 to 20 carbon atoms, an alkyleneoxy having 1 to 20 carbon atoms, or an alkyleneoxyalkylene having 1 to 20 carbon atoms, $R_1$ and $R_2$ are the same as or different from each other, and are each independently one of hydrogen, an alkyl having 1 to 20 carbon atoms, an alkoxy having 1 to 20 carbon atoms, a hydroxy group, a direct bond, or oxy. In Chemical Formula 1-6, the definition of $Z_6$ is the same as that of Z in Chemical Formula 1, and the definitions of $L_1$, $R_1$, and $R_2$ are the same as described above in Chemical Formula 1. More specifically, in Chemical Formula 1-6, $L_1$ may be a direct bond.

That is, the functional group represented by Chemical Formula 1 introduced onto the surface of the heat dissipation filler may include at least one or more of the six functional groups represented by Chemical Formulas 1-1 to 1-6.

Meanwhile, in Chemical Formula 1, $L_1$ is one of a direct bond, an alkylene having 1 to 20 carbon atoms, an alkyleneoxy having 1 to 20 carbon atoms, or an alkyleneoxyalkylene having 1 to 20 carbon atoms. An example of the alkylene having 1 to 20 carbon atoms may be propylene, or the like.

Moreover, in Chemical Formula 1, $R_1$ and $R_2$ are the same as or different from each other, and are each independently one of hydrogen, an alkyl having 1 to 20 carbon atoms, an alkoxy having 1 to 20 carbon atoms, a hydroxy group, a direct bond, or oxy.

In Chemical Formula 1, when $R_1$ or $R_2$ is a direct bond or oxy (—O—), the $R_1$ or $R_2$ may form a bond with the heat dissipation filler, or may form a bond with the adjacent functional group represented by Chemical Formula 1.

The heat dissipating filler in which the functional group represented by Chemical Formula 1 is introduced onto the surface may include a reaction product between the heat dissipation filler and a silane-based compound represented by the following Chemical Formula 3.

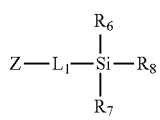

[Chemical formula 3]

wherein, in Chemical Formula 3, Z is one of an aryl having 6 to 30 carbon atoms, epoxy, (meth)acryloyloxy, an alkenyl having 2 to 40 carbon atoms, an alkenylaryl having 8 to carbon atoms, an alkyl having 1 to 20 carbon atoms, $L_1$ is one of a direct bond, an alkylene having 1 to 20 carbon atoms, an alkyleneoxy having 1 to 20 carbon atoms, or an alkyleneoxyalkylene having 1 to 20 carbon atoms, at least one of $R_6$, $R_7$ and $R_8$ is one of an alkoxy having 1 to 20 carbon atoms, or a hydroxyl group, and the others are the same as or different from each other, and are each independently one of hydrogen, an alkyl having 1 to 20 carbon atoms, an alkoxy having 1 to 20 carbon atoms or a hydroxy group.

In Chemical Formula 3, the definitions of Z and $L_1$ are the same as described above in Chemical Formula 1.

In Chemical Formula 3, at least one of $R_6$, $R_7$ and $R_8$ is one of an alkoxy having 1 to carbon atoms, or a hydroxy group, and the others are the same as or different from each other, and are each independently one of hydrogen, an alkyl having 1 to 20 carbon atoms, an alkoxy having 1 to 20 carbon atoms or a hydroxy group.

Examples of the silane-based compound represented by Chemical Formula 3 are not particularly limited. But for example, there may be mentioned trimethoxy[(3-phenyl)propyl]silane, trimethoxy[(3-oxiran-2-yl)propyl]silane, 3-(Methacryloyloxy)propyl]trimethoxysilane, 3-acryloyloxypropyltrimethoysilane, trimethoxy(vinyl)silane, p-styryltrimethoxysilane, hexyltrimethoxysialane, or the like.

Conventionally, a silyloxy group substituted with an arylamino group have been introduced onto the surface of the heat dissipation filler to improve adhesive strength, but due to the strong reactivity of the amino group, a spontaneous adhesion reaction occurs in the resin composition for bonding semiconductors during storage at room temperature and so the adhesive strength increases excessively, and there was a limit in that it is difficult to smoothly proceed a subsequent pick-up process of the semiconductor.

Further, the viscosity of the resin composition for bonding semiconductors is increased during storage at room temperature, the wettability of wafers is lowered, and in the case of the heat dissipation FOD (Fill Over Die), the problem that important embedding characteristics greatly reduce occurred.

On the other hand, as the heat dissipation filler contained in the resin composition for bonding semiconductors of the above-mentioned embodiment has a structure in which the functional group represented by Chemical Formula 1 is introduced onto the surface, not only it secures a thermal conductivity of the conventional level and has excellent heat dissipation characteristics, but also by reducing the reactivity, side reactions in the resin composition for bonding semiconductors during storage at room temperature can be minimized, thereby achieving an optimum level of viscosity and adhesive strength. Thereby, the adhesive film for a semiconductor and the dicing die-bonding film can be manufactured, and the remarkable effect that the reliability and efficiency are simultaneously improved in the entire process of dicing the semiconductor wafer.

(4) Curing Catalyst

The curing catalyst may play a role of promoting curing in the process of manufacturing the adhesive film for semiconductor due to the action of the curing agent or the resin composition for bonding semiconductors.

The curing catalyst may be contained in an amount of 0.5% by weight to 2.0% by weight, or 0.5% by weight to 1.5% by weight, or 0.8% by weight to 1.2% by weight based on the total weight of the resin composition for bonding semiconductors. As the curing catalyst is contained in the above-described content within the resin composition for semiconductor bonding, the resin composition for bonding semiconductors can ensure room temperature stability and reproducibility.

The curing catalyst may include an imidazole-based compound and an organic acid compound. The imidazole-based compound includes both an imidazole compound or an imidazole compound derivative, and the imidazole compound derivative refers to a reaction product obtained by performing substitution, elimination, addition, crosslinking, and polymerization reactions of the imidazole compound as a precursor.

Specifically, the imidazole-based compound may include an imidazole derivative compound containing an electron withdrawing functional group. The electron withdrawing functional group can decrease the electron density of a nitrogen atom contained in the imidazole-based compound, thereby lowering the catalytic reactivity of the imidazole-based compound and realizing the reaction stability at room temperature.

Examples of the electron withdrawing functional group include —F, —Cl, —Br, —I, —$CF_3$, —$CCl_3$, —$CBr_3$, —$CI_3$, —$NO_2$, —CN, —$COCH_3$, —$CO_2C_2H_5$, or the like. Preferably, a cyano group (—CN) can be introduced. When a cyano group (—CN) is introduced as the electron withdrawing functional group, solubility of the imidazole-based compound may be improved.

More specifically, the imidazole derivative compound containing the electron withdrawing functional group may be represented by the following Chemical Formula 2.

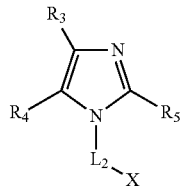

[Chemical Formula 2]

wherein, in Chemical Formula 2, X is an electron withdrawing functional group, $L_2$ is an alkylene having 1 to 20 carbon atoms, and $R_3$ to $R_5$ are each independently one of hydrogen, an alkyl having 1 to 20 carbon atoms, or an aryl having 6 to 20 carbon atoms.

More preferably, in Chemical Formula 2, X is a cyano group (—CN), $L_2$ is a methylene group in which a methyl group having 2 carbon atoms is substituted, $R_3$ is hydrogen, $R_4$ is a methyl group, and $R_5$ is an ethyl group.

On the other hand, the organic acid compound is an organic compound containing at least one acidic functional group, and examples of the acidic functional group may be a carboxy group (—COOH) or the like. As the organic acid compound reacts with the imidazole-based compound acting as a curing catalyst to convert the imidazole-based compound into a salt form, the melting point can be improved, and the reactivity with an epoxy resin or the like can be improved by the carboxylic acid remaining after the reaction.

The organic acid compound may include an aromatic polyacid compound. The aromatic polyacid compound means an aromatic organic compound containing at least two or more acidic functional groups, and as a specific example of the aromatic polyacid compound, trimesic acid (TMA) may be used.

The weight ratio of the imidazole-based compound: the organic acid compound may be 0.5:1 to 10:1, or 1:1 to 9:1, or 5:1 to 10:1. When the imidazole-based compound is added in an excessive amount, a technical problem may occur in which the catalytic reaction is excessively generated and the room-temperature storage stability may be lowered. On the other hand, when the organic acid compound is added in an excessive amount, a technical problem that the solubility is lowered may occur.

(5) Resin Composition for Bonding Semiconductors

Meanwhile, the weight ratio of the (meth)acrylate-based resin relative to the total weight of the binder resin and the curing agent may be 0.55 to 0.95. As the adhesive film for semiconductor includes the (meth)acrylate-based resin within the above-described range relative to the total weight of the binder resin and the curing agent, the adhesive film for semiconductor obtained from the resin composition for bonding semiconductors can exhibit high elasticity, excellent mechanical properties and high adhesive strength while exhibiting a relatively high modulus during initial elongation.

If the weight ratio of the (meth)acrylate-based resin relative to the total weight of the binder resin and the curing agent is lower than the above-mentioned range, the adhesive properties of the adhesive film for a semiconductor produced from the resin composition for bonding semiconductors is lowered and thus the wettability of wafers is reduced, which makes it impossible to expect a uniform cutting property, and from the viewpoint of reliability, adhesion between the wafer and the adhesive film interface is lowered, which leads to a decrease in the cohesive strength and makes the reliability vulnerable.

If the weight ratio of the (meth)acrylate-based resin relative to the total weight of the binder resin and the curing agent is higher than the above-mentioned range, the modulus generated when the adhesive film for a semiconductor produced from the resin composition for bonding semiconductors being elongated by 5% to 15% at room temperature may not be sufficient and may become significantly high, and the elongation of the above-mentioned adhesive film at room temperature may be greatly increased.

The weight ratio of the epoxy resin and the phenol resin in the resin composition for bonding semiconductors can be adjusted in consideration of the properties of the finally produced product, and for example, the weight ratio may be 10:1 to 1:10.

The resin composition for bonding semiconductors may further include an ion scavenger including: a metal oxide including one or more metals selected from the group consisting of zirconium, antimony, bismuth, magnesium, and aluminum; porous silicate; porous aluminosilicate; or zeolite.

Examples of the metal oxide including one or more metals selected from the group consisting of zirconium, antimony, bismuth, magnesium, and aluminum may include a zirconium oxide, an antimony oxide, a bismuth oxide, a magnesium oxide, an aluminum oxide, an antimony bismuth-based oxide, a zirconium bismuth-based oxide, a zirconium magnesium-based oxide, a magnesium aluminum-based oxide, an antimony magnesium-based oxide, an antimony aluminum-based oxide, an antimony zirconium-based oxide, a zirconium aluminum-based oxide, a bismuth magnesium-based oxide, a bismuth aluminum-based oxide, or a mixture of two or more kinds thereof.

The ion scavenger may serve to adsorb metal ions or halogen ions and the like existing inside the resin composition for bonding semiconductors, and thus may improve electrical reliability of the wires in contact with the adhesive film.

The content of the ion scavenger in the resin composition for bonding semiconductors is not particularly limited, but considering the reactivity with transition metal ions, workability, and the physical properties of the adhesive film, it may be included in an amount of 0.01 to 20% by weight, or 0.01 to 10% by weight, based on the total weight of the composition for bonding semiconductors.

Meanwhile, the resin composition for bonding a semiconductor may further include one or more additives selected from the group consisting of a coupling agent and an inorganic filler. Specific examples of the coupling agent and inorganic filler are not particularly limited, and components known to be usable in an adhesive for semiconductor packaging may be used without particular limitations.

The resin composition for bonding semiconductors may further include an organic solvent. Specific examples of the organic solvent include N,N-dimethylformamide, N,N-dimethylacetamide, N-methyl-2-pyrrolidone, N-methylcaprolactam, 2-pyrrolidone, N-ethylpyrrolidone, N-vinylpyrrolidone, dimethyl sulfoxide, tetramethylurea, pyridine, dimethyl sulfone, hexamethylsulfoxide, γ-butyrolactone, 3-methoxy-N,N-dimethylpropanamide, 3-ethoxy-N,N-dimethylpropanamide, 3-butoxy-N,N-dimethylpropanamide, 1,3-dimethyl-imidazolidinone, ethyl amyl ketone, methyl nonyl ketone, methyl ethyl ketone, methyl isoamyl ketone, methyl isopropyl ketone, cyclohexanone, ethylene carbonate, propylene carbonate, diglyme, 4-hydroxy-4-methyl-2-pentanone, ethylene glycol monomethyl ether, ethylene glycol monomethyl ether acetate, ethylene glycol monoethyl ether, ethylene glycol monoethyl ether acetate, ethylene glycol monopropyl ether, ethylene glycol monopropyl ether acetate, ethylene glycol monoisopropyl ether, ethylene glycol monoisopropyl ether acetate, ethylene glycol monobutyl ether, ethylene glycol monobutyl ether acetate, or the like. They may be used alone or in combination.

When the resin composition for bonding semiconductors contains an organic solvent, the amount of the solid content in the resin composition for bonding semiconductors may be 50 to 99% by weight based on the total weight of the resin composition for bonding semiconductors. The solid content may include a binder resin containing a (meth)acrylate-based resin and an epoxy resin, a curing agent, a heat dissipation filler in which a functional group represented by Chemical Formula 1 is introduced onto a surface thereof, and a curing catalyst including an imidazole-based compound and an organic acid compound.

II. Adhesive Film for Semiconductor

According to another embodiment of the present invention, there can be provided an adhesive film for semiconductor including: a polymer substrate containing a (meth)acrylate-based resin, a curing agent and an epoxy resin; a heat dissipation filler in which a functional group represented by Chemical Formula 1 is introduced onto the surface thereof; and a curing catalyst containing an imidazole-based compound and an organic acid compound, wherein the heat dissipation filler and the curing catalyst are dispersed in the polymer substrate.

On the other hand, the adhesive film for a semiconductor may have a thickness of 1 μm to 300 μm, respectively. In addition, the adhesive film for a semiconductor may have a thickness of 1 μm or more, 3 μm or more, 5 μm or more, and 10 μm or more, respectively. The adhesive film for a semiconductor may each have a thickness of 300 μm or less, or 100 μm or less, or 90 μm or less, or 70 μm or less, respectively. When the thickness of the adhesive film for a semiconductor increases or decreases by a specific value, the physical properties measured by the adhesive film for a semiconductor may also change by a certain value.

Further, the adhesive film for a semiconductor can be applied to a package having a multilayered structure of semiconductor chips to realize a more stable structure, mechanical properties such as excellent heat resistance and impact resistance, and also prevent reflow cracks and the like. In particular, even when exposed to a high temperature condition for a long time that is applied in a semiconductor manufacturing process, voids may not be substantially generated.

The adhesive film for the semiconductor has high breaking strength and low elongation at break, and thus can be applied for non-contact-type adhesive cutting, for example, DBG (Dicing Before Grinding), as well as wafer cutting using a knife blade, and has an excellent cutting property even at a low temperature, and thus, even if it is allowed to stand at room temperature after being cut, possibility of re-adhesion becomes low, thus increasing reliability and efficiency in a semiconductor manufacturing process.

The adhesive film may be used as a die attach film (DAF) for attaching a lead frame or a substrate with a die, or attaching a die with a die. Thereby, the adhesive film may be processed in the form of a die bonding film, a dicing die bonding film, or the like.

In the adhesive film for a semiconductor, more details of the (meth)acrylate-based resin, the curing agent, the epoxy resin, the heat dissipation filler in which a functional group represented by Chemical Formula 1 is introduced onto the surface thereof, and the curing catalyst containing an organic acid compound include those described above in the embodiment.

The polymer substrate may include a (meth)acrylate-based resin, a curing agent and an epoxy resin. And, a heat dissipation filler in which a functional group represented by Chemical Formula 1 is introduced onto the surface thereof, and the curing catalyst may be dispersed in the polymer substrate. The heat dissipation filler in which a functional group represented by Chemical Formula 1 is introduced onto the surface thereof, and the curing catalyst may be dispersed in the inside and outside surfaces of the polymer substrate.

The adhesive film for a semiconductor may be obtained by the method of coating and drying the resin composition for bonding semiconductors of the above-mentioned embodiment. Examples of the coating method and the drying method are not particularly limited, and various methods widely known in general film manufacturing processes may be applied without limitation.

III. Dicing Die Bonding Film

According to another embodiment of the invention, there can be provided a dicing die bonding film including: a substrate film; a tacky layer formed on the substrate film; and an adhesive layer formed on the tacky layer and including the adhesive film for a semiconductor.

The details of the resin composition for bonding semiconductors are the same as those described above in the other embodiment.

Meanwhile, the type of the substrate film included in the dicing die bonding film is not particularly limited, and for example, plastic films or metal foils and the like known in this field may be used. For example, the substrate film may include low density polyethylene, linear polyethylene, medium density polyethylene, high density polyethylene, ultra-low density polyethylene, a random copolymer of polypropylene, a block copolymer of polypropylene, a homopolypropylene, a polymethylpentene, an ethylene-vinyl acetate copolymer, an ethylene-methacrylic acid copolymer, an ethylene-methylmethacrylate copolymer, an ethylene-ionomer copolymer, an ethylene-vinyl alcohol copolymer, a polybutene, a copolymer of styrene, or a mixture of two or more kinds thereof. The substrate film including a mixture of two or more types of polymers refer to including both a multilayered film in which the films each containing the above-mentioned polymers are stacked in two or more layers, and a mono-layered film including two or more types of the above-mentioned polymers.

The thickness of the substrate film is not particularly limited, and it is commonly formed to have a thickness of 10 µm to 200 µm, preferably 50 µm to 180 µm. If the thickness is less than 10 µm, there is a concern that the control of cut depth may be unstable in a dicing process, and if it is greater than 200 µm, a large amount of burrs may be generated in a dicing process, or the elongation ratio may decrease, and thus an expanding process may not be precisely achieved.

The substrate film may be subjected to conventional physical or chemical treatments such as a matte treatment, a corona discharge treatment, a primer treatment, a crosslinking treatment, and the like, as necessary.

Meanwhile, the tacky layer may include a UV curable adhesive or a heat curable adhesive. In case where the UV curable adhesive is used, UV is irradiated from the substrate film side to increase cohesive force and glass transition temperature of the adhesive, thus lowering adhesive strength, and in a case where the heat curable adhesive is used, the temperature is increased to lower the adhesive strength.

Moreover, the UV curable adhesive may include a (meth)acrylate-based resin, a UV curable compound, a photoinitiator, and a crosslinking agent.

The (meth)acrylate-based resin may have a weight average molecular weight of 100,000 g/mol to 1,500,000 g/mol, preferably 200,000 g/mol to 1,000,000 g/mol. If the weight average molecular weight is less than 100,000 g/mol, the coating property or cohesive force may be lowered, and thus a residue may remain on the adherent at the time of peeling, or a breakage phenomenon of the adhesive may occur. Further, if the weight average molecular weight is greater than 1,500,000 g/mol, the substrate resin may interfere with the reaction of the UV curable compound, and thus there is a concern that a decrease in peel strength may not be efficiently achieved.

Examples of the (meth)acrylate-based resin may include a copolymer of (meth)acrylic acid ester-based monomers and crosslinkable functional group-containing monomers. At this time, examples of the (meth)acrylic acid ester-based monomers may include alkyl (meth)acrylate, more specifically, monomers having an alkyl group having 1 to 12 carbon atoms, such as pentyl (meth)acrylate, n-butyl (meth) acrylate, ethyl (meth)acrylate, methyl (meth)acrylate, hexyl (meth)acrylate, n-octyl (meth)acrylate, isooctyl (meth)acrylate, 2-ethylhexyl (meth)acrylate, dodecyl (meth)acrylate, decyl (meth)acrylate, or a mixture of two or more thereof. As monomers containing an alkyl having a large number of carbon atoms are used, the glass transition temperature of the final copolymer becomes lower, and thus appropriate monomers may be selected according to the desired glass transition temperature.

Further, examples of the crosslinkable functional group-containing monomers may include hydroxyl group-containing monomers, carboxyl group-containing monomers, nitrogen-containing monomers, or mixtures of two or more thereof. At this time, examples of the hydroxyl group-containing compounds may include 2-hydroxyethyl (meth) acrylate, 2-hydroxypropyl (meth)acrylate, and the like, examples of the carboxyl group-containing compounds may include (meth)acrylic acid and the like, and examples of the nitrogen-containing monomers may include (meth)acrylonitrile, N-vinyl pyrrolidone, N-vinyl caprolactam, and the like, but are not limited thereto.

In the (meth)acrylate-based resin, carbon-carbon double bond-containing low molecular weight compounds such as vinyl acetate, styrene, acrylonitrile, and the like may be additionally included in terms of the improvement of other functionalities such as compatibility.

Further, the type of the UV curable compounds is not particularly limited, and for example, multifunctional compounds having a weight average molecular weight of 100 g/mol to 300,000 g/mol, or 500 g/mol to 100,000 g/mol (e.g. multifunctional urethane acrylate, multifunctional acrylate monomers or oligomers, and the like) may be used. One of ordinary knowledge in the art could easily select appropriate compounds according to the desired use.

The content of the UV curable compound may be 5 to 400 parts by weight, preferably 10 to 200 parts by weight, based on 100 parts by weight of the above-mentioned substrate resin. If the content of the UV curable compound is less than 5 parts by weight, a decrease in the adhesion strength after curing may not be sufficient, and thus there is a concern of lowering the pick-up property, and if it is greater than 400 parts by weight, cohesive force of the adhesive before UV irradiation may be insufficient, or peeling of a release film and the like may not be easily performed.

The type of the photoinitiator is also not particularly limited, and those commonly known in the art may be used. The content of the photoinitiator may be 0.05 parts by weight to 20 parts by weight, based on 100 parts by weight of the UV curable compound. If the content of the photoinitiator is less than 0.05 parts by weight, a curing reaction by UV irradiation may become insufficient, which may reduce the pick-up property, and if it is greater than 20 parts by weight, a crosslinking reaction may occur with a short unit in the curing process, unreacted UV curable compounds may be generated, which may cause residue on the surface of the adherent, or the peel strength after curing may excessively decrease which may lower the pick-up property.

Further, the type of the crosslinking agent that is included in the tacky part to afford adhesive strength and cohesive force is also not particularly limited, and conventional compounds such as isocyanate-based compounds, aziridine-based compounds, epoxy-based compounds, metal chelate-based compounds, and the like may be used. The crosslinking agent may be included in an amount of 2 parts by weight to 40 parts by weight, preferably 2 parts by weight to 20 parts by weight, based on 100 parts by weight of the base resin. If the content of the crosslinking agent is less than 2 parts by weight, cohesive force of the adhesive may be insufficient, and if the content is greater than 20 parts by weight, adhesion strength before UV irradiation may be insufficient, and thus there is a concern of chip scattering and the like.

Further, in the tacky layer, tackifiers such as a rosin resin, a terpene resin, a phenol resin, a styrene resin, an aliphatic petroleum resin, an aromatic petroleum resin, or an aliphatic aromatic copolymer petroleum resin may be further included.

A method for forming a tacky layer including the above-mentioned components on a substrate film is not particularly limited, and for example, a method of directly coating an adhesive composition of the present invention onto a substrate film to form a tacky layer, or a method of firstly coating the adhesive composition onto a peelable substrate to prepare a tacky layer, and then transcribing the tacky layer to a substrate film using a peelable substrate, and the like may be used.

In this case, the methods of coating and drying the adhesive composition are not particularly limited, and for example, a method of coating the composition including the above components as it is, or diluting it in an appropriate organic solvent and coating by known means such as a comma coater, a gravure coater, a die coater, a reverse coater, and the like, and then drying the solvent at a temperature of 60° to 200° for 10 s to 30 min, may be used. Further, in the above process, an aging process may be additionally carried out for progressing sufficient crosslinking reaction of the adhesive.

The thickness of the tacky layer is not particularly limited, but for example, it may be in the range of 10 μm to 500 μm.

Meanwhile, as described above, the adhesive layer is formed on the tacky layer, and may include the adhesive film for a semiconductor of the above-mentioned embodiment. The details of the adhesive film for a semiconductor include those described above.

The thickness of the adhesive layer is not particularly limited, but for example, it may be in the range of 1 μm to 100 μm, or 3 μm to 50 μm.

The dicing die bonding film may further include a release film formed on the adhesive layer. Examples of the release film that can be used may include one or more kinds of plastic films such as a polyethylene terephthalate film, a polytetrafluoroethylene film, a polyethylene film, a polypropylene film, a polybutene film, a polybutadiene film, a vinylchloride copolymer film, a polyimide film, and the like.

The surface of the release film as described above may be release-treated with one or more of alkyd-based, silicon-based, fluorine-based, unsaturated ester-based, polyolefin-based, or wax-based release agents, among which heat resistant alkyd-based, silicon-based, or fluorine-based release agents are particularly preferred.

The release film may be commonly formed to have a thickness of 10 μm to 500 μm, preferably 20 μm to 200 μm, but is not limited thereto.

A method for manufacturing the above-described dicing die bonding film is not particularly limited, and for example, a method of sequentially forming a tacky part, an adhesive part, and a release film on a substrate film, or a method of separately preparing a dicing film (a substrate film+a tacky part) and a release film on which a die bonding film or an adhesive part is formed, and then laminating them, and the like, may be used.

The lamination method is not particularly limited, and hot roll lamination or a laminate press may be used, among which hot roll lamination is preferred in terms of the possibility of a continuous process, and process efficiency. The hot roll lamination may be carried out at a temperature of 10° C. to 100° C. under a pressure of 0.1 kgf/cm$^2$ to 10 kgf/cm$^2$, but is not limited thereto.

In the dicing die bonding film, the adhesive strength between the substrate film and the adhesive layer including the adhesive film for semiconductors of the other embodiment may be 180 gf/25 mm$^2$ or less, or 100 gf/25 mm$^2$ to 180 gf/25 mm$^2$, or 100 gf/25 mm$^2$ to 150 gf/25 mm$^2$, or 120 gf/25 mm$^2$ to 140 gf/25 mm$^2$, or 125 gf/25 mm$^2$ to 135 gf/25 mm$^2$, or 128.5 gf/25 mm$^2$ or more and 132.1 gf/25 mm$^2$ or less.

At this time, the adhesive strength can be measured in accordance with KS-A-01107(8) (i.e., Korean Industrial Standard Testing Procedure for Adhesive Tapes and Sheets) in which the dicing die bonding film is stored for 48 hours in an oven at a temperature of 40° C., and then the peel strength between the substrate film and the adhesive film is measured.

In the dicing die bonding film, if the adhesive strength between the substrate film and the adhesive layer including the adhesive film for semiconductors of the other embodiment is excessively increased by greater than 180 gf/25 mm$^2$, the storage stability is reduced due to the adhesion reaction between the films at room temperature, and a relatively high adhesive strength is maintained even after UV irradiation, so that the pick-up property of the chip after dicing can be lowered.

Meanwhile, after subjecting the dicing die bonding film to UV irradiation, the adhesive strength between the substrate film and the adhesive layer including the adhesive film for semiconductors of the other embodiment may be 30 gf/25 mm$^2$ or less, or 1 gf/25 mm$^2$ to 30 gf/25 mm$^2$, or 1 gf/25 mm$^2$ to 20 gf/25 mm$^2$, or 5 gf/25 mm$^2$ to 15 gf/25 mm$^2$, or 10 gf/25 mm$^2$ to 15 gf/25 mm$^2$, or 10 gf/25 mm$^2$ to 13 gf/25 mm$^2$, or 10.10 gf/25 mm$^2$ or more and 12.39 gf/25 mm$^2$ or less. The adhesive strength after UV irradiation can be measured in accordance with KS-A-01107(8) (i.e., Korean Industrial Standard Testing Procedure for Adhesive Tapes and Sheets) in which the dicing die bonding film is irradiated with a high-pressure mercury lamp having an illuminance of 70 mW/cm$^2$ for 5 seconds and then irradiated with an exposure dose of 400 mJ/cm$^2$, and then the peel strength between the substrate film and the adhesive film is measured.

In the dicing die bonding film, if the adhesive strength between the substrate film and the adhesive layer including the adhesive film for semiconductors of the other embodiment is excessively increased by greater than 30 gf/25 mm$^2$, the pick-up property of the chip after dicing can be lowered.

IV. Method for Dicing Semiconductor Wafer

On the other hand, according to yet another embodiment of the invention, a method for dicing a semiconductor wafer is provided, including the steps of: pre-treating of completely cutting or partially treating to enable cut a semiconductor wafer including the dicing die bonding film and a wafer laminated on at least one side of the dicing die bonding film; and irradiating ultraviolet light to the substrate film of the pre-treated semiconductor wafer and picking up individual chips separated by the cutting of the semiconductor.

The details of the dicing die bonding film include those described above.

Except for the particulars regarding the steps of the dicing method, commonly known apparatuses and methods used for the dicing method of a semiconductor wafer and the like may be used without particular limitations.

The method for dicing a semiconductor wafer may further include a step of expanding the semiconductor wafer after the pretreatment. In this case, processes of irradiating ultraviolet light to the base film of the expanded semiconductor wafer and picking up individual chips separated by cutting of the semiconductor wafer are followed By using the dicing die bonding film including the dicing film, burrs that may be generated during a dicing process of a semiconductor wafer may be minimized, thus preventing contamination of a semiconductor chip and improving reliability and lifetime of a semiconductor chip.

Advantageous Effects

According to the present invention, a resin composition for bonding semiconductors having excellent storage stability at room temperature, and excellent embedding property and adhesive strength of semiconductors, and capable of implementing improved thermal conduction characteristics, an adhesive film for semiconductor obtained therefrom, a dicing die bonding film using the same and a method for dicing a semiconductor wafer can be provided.

DETAILED DESCRIPTION OF THE EMBODIMENTS

Specific embodiments of the invention will be described in more detail by way of the following examples. However, these examples are only to illustrate specific embodiments of the invention, and the scope of the invention is not limited thereto.

SYNTHESIS EXAMPLE: THERMOPLASTIC ACRYLATE RESIN

Synthesis Example 1: Synthesis of Thermoplastic Acrylate Resin 1

70 g of butyl acrylate, 15 g of acrylonitrile, 5 g of glycidyl methacrylate, and 10 g of benzyl methacrylate were mixed with 100 g of toluene, and the mixture was reacted at 80° C. for about 12 hours to obtain an acrylate resin 1 having a glycidyl group introduced into a branched chain (weight average molecular weight:about 400,000 g/mol, glass transition temperature: 10° C.).

Then, the acrylate resin 1 was dissolved in dichloromethane, cooled, and then titrated with a 0.1N KOH methanol solution, and it was confirmed that the hydroxyl group equivalent weight was about 0.03 eq/kg.

Synthesis Example 2: Synthesis of Thermoplastic Acrylate Resin 2

65 g of butyl acrylate, 15 g of acrylonitrile, 5 g of glycidyl methacrylate, and 15 g of benzyl methacrylate were mixed with 100 g of toluene, and the mixture was reacted at 80° C. for about 12 hours to obtain an acrylate resin 2 having a glycidyl group introduced into a branched chain (weight average molecular weight: about 200,000 g/mol, glass transition temperature: 14° C.).

Then, the acrylate resin 2 was dissolved in dichloromethane, cooled, and then titrated with a 0.1N KOH methanol solution, and it was confirmed that the hydroxyl group equivalent weight was about 0.03 eq/kg.

Synthesis Example 3: Synthesis of Thermoplastic Acrylate Resin 3

60 g of butyl acrylate, 15 g of acrylonitrile, 5 g of glycidyl methacrylate, and 20 g of benzyl methacrylate were mixed with 100 g of toluene, and the mixture was reacted at 80° C. for about 12 hours to obtain an acrylate resin 3 having a glycidyl group introduced into a branched chain (weight average molecular weight: about 520,000 g/mol, glass transition temperature: 15° C.).

Then, the acrylate resin 3 was dissolved in dichloromethane, cooled, and then titrated with a 0.1N KOH methanol solution, and it was confirmed that the hydroxyl group equivalent weight was about 0.03 eq/kg.

EXAMPLE: PREPARATION OF RESIN COMPOSITION FOR BONDING SEMICONDUCTORS AND ADHESIVE FILM FOR SEMICONDUCTORS

Example 1

4 g of phenol resin KH-1160 (produced by DIC Corp., cresol novolac resin, hydroxyl equivalent weight: 190 g/eq, softening point: 65° C.), which is a curing agent for epoxy resin, 2 g of epoxy resin EOCN-103S (produced by Nippon Kayaku Co., Ltd., cresol novolac type epoxy resin, epoxy equivalent weight: 214 g/eq, softening point: 80° C.), 5 g of liquid epoxy resin RE-310S (produced by Nippon Kayaku Co., Ltd., bisphenol A epoxy resin, epoxy equivalent weight: 810 g/eq), 85 g of alumina filler surface-treated with trimethoxy[(3-phenyl)propyl]silane coupling agent was milled using a milling machine under methyl ethyl ketone solvent.

Then, to this mixture, 4 g of thermoplastic acrylate resin 1 (Mw: 520,000, glass transition temperature: 10° C.) of Synthesis Example 1, 0.1 g of silane coupling agent A-187 (GE Toshiba Silicone, gamma-glycidoxypropyltrimethoxysilane), 0.1 g of 1-cyanoethyl-2-ethyl-4-methylimidazole (2E4MZ-CN) as a curing accelerator, and 0.1 g of trimesic acid (TMA) were added and further milled for 2 hours to obtain a resin composition solution for bonding semiconductors (solid content: 80 wt % concentration). This milling solution was coated using an automatic coating machine to obtain a film having a film thickness of 115 μm.

Example 2

A resin composition for bonding semiconductors and an adhesive film for semiconductors were manufactured in the same manner as in Example 1, except that 0.18 g of 1-cyanoethyl-2-ethyl-4-methylimidazole (2E4MZ-CN) and 0.02 g of trimesic acid (TMA) were added as a curing accelerator.

Example 3

A resin composition for bonding semiconductors and an adhesive film for semiconductors were manufactured in the same manner as in Example 1, except that an alumina filler surface-treated with trimethoxy[(3-oxiran-2-yl)propyl]silane coupling agent was used instead of an alumina filler surface-treated with trimethoxy[(3-phenyl)propyl]silane coupling agent as the filler.

Example 4

A resin composition for bonding semiconductors and an adhesive film for semiconductors were manufactured in the same manner as in Example 2, except that an alumina filler surface-treated with trimethoxy[(3-oxiran-2-yl)propyl]silane coupling agent was used instead of an alumina filler surface-treated with trimethoxy[(3-phenyl)propyl]silane coupling agent as the filler.

Example 5

A resin composition for bonding semiconductors and an adhesive film for semiconductors were manufactured in the same manner as in Example 2, except that an alumina filler surface-treated with [3-(methacryloyloxy)propyl]trimethoxysilane coupling agent was used instead of an alumina filler surface-treated with trimethoxy[(3-phenyl)propyl]silane coupling agent as the filler.

Example 6

A resin composition for bonding semiconductors and an adhesive film for semiconductors were manufactured in the same manner as in Example 1, except that an alumina filler surface-treated with [3-(methacryloyloxy)propyl]trimethoxysilane coupling agent was used instead of an alumina filler surface-treated with trimethoxy[(3-phenyl)propyl]silane coupling agent as the filler.

Example 7

A resin composition for bonding semiconductors and an adhesive film for semiconductors were manufactured in the same manner as in Example 1, except that an alumina filler surface-treated with 3-acryloyloxypropyltrimethoysilane coupling agent was used instead of an alumina filler surface-treated with trimethoxy[(3-phenyl)propyl]silane coupling agent as the filler.

Example 8

A resin composition for bonding semiconductors and an adhesive film for semiconductors were manufactured in the same manner as in Example 2, except that an alumina filler surface-treated with 3-acryloyloxypropyltrimethoysilane coupling agent was used instead of an alumina filler surface-treated with trimethoxy[(3-phenyl)propyl]silane coupling agent as the filler.

Example 9

A resin composition for bonding semiconductors and an adhesive film for semiconductors were manufactured in the same manner as in Example 1, except that an alumina filler surface-treated with trimethoxy(vinyl)silane coupling agent was used instead of an alumina filler surface-treated with trimethoxy[(3-phenyl)propyl]silane coupling agent as the filler.

Example 10

A resin composition for bonding semiconductors and an adhesive film for semiconductors were manufactured in the same manner as in Example 2, except that an alumina filler surface-treated with trimethoxy(vinyl)silane coupling agent was used instead of an alumina filler surface-treated with trimethoxy[(3-phenyl)propyl]silane coupling agent as the filler.

Example 11

A resin composition for bonding semiconductors and an adhesive film for semiconductors were manufactured in the same manner as in Example 1, except that an alumina filler surface-treated with p-styryltrimethoxysilane coupling agent was used instead of an alumina filler surface-treated with trimethoxy[(3-phenyl)propyl]silane coupling agent as the filler.

Example 12

A resin composition for bonding semiconductors and an adhesive film for semiconductors were manufactured in the same manner as in Example 2, except that an alumina filler surface-treated with p-styryltrimethoxysilane coupling agent was used instead of an alumina filler surface-treated with trimethoxy[(3-phenyl)propyl]silane coupling agent as the filler.

Example 13

A resin composition for bonding semiconductors and an adhesive film for semiconductors were manufactured in the same manner as in Example 1, except that an alumina filler surface-treated with hexyltrimethoxysialane coupling agent was used instead of an alumina filler surface-treated with trimethoxy[(3-phenyl)propyl]silane coupling agent as the filler.

Example 14

A resin composition for bonding semiconductors and an adhesive film for semiconductors were manufactured in the same manner as in Example 2, except that an alumina filler surface-treated with hexyltrimethoxysialane coupling agent was used instead of an alumina filler surface-treated with trimethoxy[(3-phenyl)propyl]silane coupling agent as the filler.

COMPARATIVE EXAMPLE: PREPARATION OF RESIN COMPOSITION FOR BONDING SEMICONDUCTORS AND ADHESIVE FILM FOR SEMICONDUCTORS

Comparative Example 1

A resin composition for bonding semiconductors and an adhesive film for semiconductors were manufactured in the same manner as in Example 1, except that an alumina filler surface-treated with trimethoxy[(3-phenylamino)propyl]silane coupling agent was used instead of an alumina filler surface-treated with trimethoxy[(3-phenyl)propyl]silane coupling agent as the filler.

Comparative Example 2

A resin composition for bonding semiconductors and an adhesive film for semiconductors were manufactured in the same manner as in Comparative Example 1, except that 0.1 g of dicyandiamide (DICY) and 0.1 g of 2,4-diamino-6-[2-(2-methylimidazol-1-yl-ethyl)-s-triazine iso-cynanurate (2MA-OK) were used as a curing accelerator.

Comparative Example 3

A resin composition for bonding semiconductors and an adhesive film for semiconductors were manufactured in the same manner as in Comparative Example 1, except that 0.2 g of 2-ethyl-4-methylimidazole (2E4MZ) was used alone as a curing accelerator.

EXPERIMENTAL EXAMPLE

Experimental Example 1. Flattening Treatment of Adhesive Film and Measurement of Surface Roughness Each of the film obtained by coating in Examples and Comparative Examples was passed through a 70° C. SUS ROLL thermal laminating machine to flatten the surface. Then, the degree of flattening was determined by measuring the roughness of the film surface using an optical profiler, and the results are shown in Tables 1 and 2 below.

Experimental Example 2. Measurement of Thermal Conductivity of Adhesive Film

Each of the adhesive films obtained in Experimental Example 1 was laminated to a thickness of 600 μm using a rubber roller laminating machine. The film thus obtained was cured to finally obtain a cured film. Then, the specimen was prepared in units of 10 mm*10 mm, and the thermal conductivity was measured using a thermal conductivity meter LFA467 by laser flash method, and the results are shown in Tables 1 and 2 below.

Experimental Example 3. Measurement of Viscosity of Film

Each of the adhesive films obtained in Experimental Example 1 was laminated to a thickness of 600 μm using a rubber roller laminating machine. The laminated film thus obtained was cut into a circular shape with a size of 8 mm to prepare a specimen for measurement, and the viscosity of the specimen was measured using a rheometer of TA Instruments (model name: ARES-G2). The results are shown in Tables 1 and 2 below.

Experimental Example 4. Measurement of Wettability of Wafer

Each of the adhesive films obtained in Experimental Example 1 was prepared into a circular shape with a diameter of 22 cm. The circular film thus prepared was laminated onto a PO film coated with an adhesive layer to prepare a dicing die bonding film.

Then, separately, 80 μm wafer was laminated onto a dicing film, cut into 8 mm*8 mm, and then a thermal lamination of the cut wafer and adhesive film was performed at 70° C. using a mounting device, and it was determined whether or not unadhered part of the adhesive film occurred. The results are shown in Tables 1 and 2 below.

Experimental Example 5. Simulation to Remove Residual Voids during Curing

Each of the adhesive films obtained in Experimental Example 1 was prepared into a circular shape with a diameter of 22 cm. The circular film thus prepared was laminated onto a PO film coated with an adhesive layer to prepare a dicing die bonding film.

Then, the thermal lamination was performed with the wafer at 70° C. using a mounting apparatus, and the wafer and the adhesive film were then diced into a size of 12 mm*9 mm.

The obtained die bonding film was die-attached onto the PCB, pressurized and cured at 7 atm and 150° C. for 60 minutes. The entire PCB was scanned using an ultrasonic imaging device to evaluate the embedding property of the heat dissipation film. The results are shown in Tables 1 and 2 below.

Experimental Example 6, Measurement of Film Adhesion Strength at Room Temperature (1) Adhesive Strength Before UV Irradiation Each of the adhesive films obtained in Experimental Example 1 was prepared into a size complying with the standard. The adhesive film thus prepared was laminated onto a PO film coated with an adhesive layer to prepare a dicing die bonding film.

After that, the dicing die bonding film was stored in an oven at a temperature of 40° C. for 48 hours, and then the adhesive strength (peel strength) of the PO film and the adhesive film was measured in accordance with KS-A-01107(8) (i.e., Korean Industrial Standard Testing Procedure for Adhesive Tapes and Sheets). The measured peel strength was defined as an adhesive strength before UV irradiation.

Specifically, the film sample was pressed by reciprocating once at a speed of 300 mm/min using a pressing roller having a load of 2 kg. 30 minutes after pressing, the folded parts of the adhesive films respectively obtained in Experimental Example 1 were overturned at 180° and peeled off about 25 mm. Then, each of the samples obtained in Experimental Example 1 was fixed to the upper clip of the tensile strength tester (ION load cell), and the PO film was fixed to the lower clip. The load when peeled off at a tensile speed of 300 mm/min was measured for 10 specimens, and then the average value was calculated and measured. The results are shown in Tables 1 and 2 below. As the tensile tester, "Instron Series 1X/s Automated materials Tester-3343" was used.

(2) Adhesive Strength after UV Irradiation

The dicing die bonding film was irradiated with a high-pressure mercury lamp having an illuminance of 70 mW/cm$^2$ for 5 seconds and irradiated with an exposure dose of 400 mJ/cm$^2$. After that, the film was stored in an oven at a temperature of 40° C. for 48 hours, and then the adhesive strength (peel strength) of the PO film and the adhesive film was measured in accordance with KS-A-01107(8) (i.e., Korean Industrial Standard Testing Procedure for Adhesive Tapes and Sheets). The measured peel strength was defined as an adhesive strength after UV irradiation.

Specifically, the film sample was pressed by reciprocating once at a speed of 300 mm/min using a pressing roller having a load of 2 kg. 30 minutes after the pressing, the folded parts of the adhesive films respectively obtained in Experimental Example 1 were overturned at 1800 and peeled off about 25 mm. Then, each of the samples obtained in Experimental Example 1 was fixed to the upper clip of the tensile strength tester (ION load cell), and the PO film was fixed to the lower clip. The load when peeled off at a tensile speed of 300 mm/m was measured for 10 specimens, and then the average value was calculated and measured. The results are shown in Tables 1 and 2 below. As the tensile tester, "Instron Series 1X/s Automated materials Tester-3343" was used.

TABLE 1

| Experimental Result of Examples | | | | | | | | | |
| --- | --- | --- | --- | --- | --- | --- | --- | --- | --- |
| Category | Unit | Ex. 1 | Ex. 2 | Ex. 3 | Ex. 4 | Ex. 5 | Ex. 6 | Ex. 7 | Ex. 8 |
| Film roughness | nm | 20 | 20 | 20 | 20 | 20 | 20 | 20 | 20 |
| Thermal conductivity | w/mK | 2.0 | 2.0 | 2.0 | 2.0 | 2.0 | 2.0 | 2.0 | 2.0 |
| b-stage | Pas@70° C. | 46550 | 44280 | 45023 | 40283 | 45665 | 45135 | 44526 | 44658 |
| Viscosity | Pas@120° C. | 4052 | 4372 | 4295 | 4032 | 4325 | 4315 | 4228 | 4237 |
| Unadhered part of wafer | % | 0 | 0 | 0 | 0 | 0 | 0 | 0 | 0 |
| Embedding property | % | 100 | 100 | 100 | 100 | 100 | 100 | 100 | 100 |

TABLE 1-continued

Experimental Result of Examples

| | | | | | | | | |
|---|---|---|---|---|---|---|---|---|
| Adhesive strength (before UV irradiation) | gf/25 mm² | 129.7 | 130.8 | 131.2 | 130.5 | 132.5 | 132.1 | 131.8 | 130.0 |
| Adhesive strength (after UV irradiation) | gf/25 mm² | 10.67 | 11.58 | 12.39 | 10.80 | 10.78 | 10.56 | 10.13 | 10.85 |

| Category | Unit | Ex. 9 | Ex. 10 | Ex. 11 | Ex. 12 | Ex. 13 | Ex. 14 |
|---|---|---|---|---|---|---|---|
| Film roughness | nm | 20 | 20 | 20 | 20 | 20 | 20 |
| Thermal conductivity | w/mK | 2.0 | 2.0 | 2.0 | 2.0 | 2.0 | 2.0 |
| b-stage Viscosity | Pas@70° C. | 42145 | 42251 | 42365 | 42505 | 41512 | 41322 |
| | Pas@120° C. | 4012 | 4215 | 4005 | 4029 | 4010 | 4008 |
| Unadhered part of wafer | % | 0 | 0 | 0 | 0 | 0 | 0 |
| Embedding property | % | 100 | 100 | 100 | 100 | 100 | 100 |
| Adhesive strength (before UV irradiation) | gf/25 mm² | 132.5 | 131.5 | 128.5 | 129.6 | 131.4 | 13.5 |
| Adhesive strength (after UV irradiation) | gf/25 mm² | 10.11 | 10.25 | 10.26 | 10.34 | 10.10 | 10.43 |

TABLE 2

Experiment Result of Comparative Examples

| Category | Unit | Comp. Ex. 1 | Comp. Ex. 2 | Comp. Ex. 3 |
|---|---|---|---|---|
| Film roughness | nm | 20 | 20 | 20 |
| Thermal conductivity | w/mK | 1.7 | 1.8 | 1.7 |
| b-stage Viscosity | Pas@70° C. | 61382 | 55035 | 62100 |
| | Pas@120° C. | 10382 | 8059 | 11002 |
| Unadhered part of wafer | % | 0 | 0 | 0 |
| Embedding property | % | 95 | 89 | 85 |
| Adhesive strength (before UV irradiation) | gf/25 mm² | 190.05 | 200.01 | 220.25 |
| Adhesive strength (after UV irradiation) | gf/25 mm² | 30.32 | 29.31 | 35.25 |

Examples 1 to 14 produced from the resin composition of Synthesis Examples using: a polymer substrate containing (meth)acrylate-based resin, a heat dissipation filler including an alumina filler surface-treated with phenyl alkyl silane, an alumina filler surface-treated with epoxy alkyl silane, an alumina filler surface-treated with methacryloyloxy alkyl silane, an alumina filler surface-treated with acryloyloxy alkyl silane, an alumina filler surface-treated with vinyl silane, an alumina filler surface-treated with styryl silane, or an alumina filler surface-treated with alkyl silane, and a curing catalyst mixed with 2E4MZ-CN and TMA not only had a high thermal conductivity of 2.0 w/Mk and a high embedding property of 100%, but also had a viscosity at 70° C. of 40283 Pas or more and 46550 Pas or less, a viscosity at 120° C. of 4005 Pas or more and 4372 Pas or less, a low adhesive strength of 128.5 gf/25 mm² or more and 132.1 gf/25 mm² or less during room-temperature storage before UV irradiation, and a low adhesive strength of 10.10 gf/25 mm² or more and 12.39 gf/25 mm² or less during room-temperature storage after UV irradiation. On the contrary, it was confirmed that the adhesive films produced from the resin composition of Comparative Examples 1 to 3 not only had a thermal conductivity of 1.7 w/Mk or more and 1.8 w/Mk or less which was lower than that of Examples, an embedding property of 89% or more and 95% or less which is lower than that of Examples, but also had a viscosity at 70° C. of 55035 Pas or more and 62100 Pas or less and a viscosity at 120° C. of 8059 Pas or more and 11002 Pas or less which excessively increased compared to those of Examples, and an adhesive strength of 190.05 gf/25 mm² or more and 220.25 gf/25 mm² or less during room-temperature storage before UV irradiation and an adhesive strength of 29.31 gf/25 mm² or more and 32.25 gf/25 mm² or less during room-temperature storage after UV irradiation which were higher than those of Examples.

Therefore, it was confirmed that the adhesive films of Examples 1 to 14 not only have a higher thermal conductivity than the adhesive films of Comparative Examples 1 to 3 and have an excellent embedding property of wafers through the optimum viscosity range, but also reduce the adhesive strength during storage at room temperature before and after UV irradiation, thus having excellent storage stability.

The invention claimed is:

1. A resin composition for bonding semiconductors comprising:
    a binder resin containing a (meth)acrylate-based resin and an epoxy resin;
    a curing agent;
    a heat dissipation filler surface-treated with a functional group represented by Chemical Formula 1;
    a coupling agent; and
    a curing catalyst containing an imidazole-based compound and an organic acid compound,

[Chemical Formula 1]

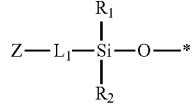

$$Z-L_1-\underset{\underset{R_2}{|}}{\overset{\overset{R_1}{|}}{Si}}-O-*$$

wherein, in the Chemical Formula 1,

Z is an aryl having 6 to 30 carbon atoms, (meth)acryloyloxy, an alkenyl having 2 to 40 carbon atoms, an alkenylaryl having 8 to 40 carbon atoms, or an alkyl having 1 to 20 carbon atoms, $L_1$ is a direct bond, an alkylene having 1 to 20 carbon atoms, an alkyleneoxy having 1 to 20 carbon atoms, or an alkyleneoxyalkylene having 1 to 20 carbon atoms, and $R_1$ and $R_2$ are the same as or different from each other, and are each independently hydrogen, an alkyl having 1 to 20 carbon atoms, an alkoxy having 1 to 20 carbon atoms, a hydroxy group, a direct bond, or oxy, when R1 or R2 is a direct bond or oxy, the R1 or R2 form a bond with the heat dissipation filler, or form a bond with the adjacent functional group represented by Chemical Formula 1.

2. The resin composition for bonding semiconductors according to claim 1,
wherein a weight ratio of the imidazole-based compound and the organic acid compound is 0.5:1 to 10:1.

3. The resin composition for bonding semiconductors according to claim 1,
wherein the organic acid compound includes an aromatic polyacid compound.

4. The resin composition for bonding semiconductors according to claim 1,
wherein the imidazole-based compound includes an imidazole derivative compound containing an electron withdrawing functional group.

5. The resin composition for bonding semiconductors according to claim 4,
wherein the imidazole derivative compound containing the electron withdrawing functional group is represented by Chemical Formula 2,

[Chemical Formula 2]

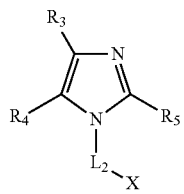

wherein, in the Chemical Formula 2,
X is an electron withdrawing functional group,
$L_2$ is an alkylene having 1 to 20 carbon atoms, and
$R_3$ to $R_5$ are each independently hydrogen, an alkyl having 1 to 20 carbon atoms, or an aryl having 6 to 20 carbon atoms.

6. The resin composition for bonding semiconductors according to claim 1,
comprising the curing catalyst in an amount of 0.5% by weight to 2.0% by weight based on the total weight of the resin composition for bonding semiconductors.

7. The resin composition for bonding semiconductors according to claim 1,
wherein the (meth)acrylate-based resin has a hydroxyl equivalent weight of 0.15 eq/kg or less.

8. The resin composition for bonding semiconductors according to claim 1,
wherein a weight ratio of the (meth)acrylate-based resin relative to the total weight of the binder resin and the curing agent is 0.55 to 0.95.

9. The resin composition for bonding semiconductors according to claim 1,
wherein the (meth)acrylate-based resin includes a (meth)acrylate-based repeating unit containing an epoxy-based functional group and a (meth)acrylate-based repeating unit (BzMA) containing an aromatic functional group, and
the (meth)acrylate-based functional group containing an aromatic functional group is in an amount of 2% by weight to 40% by weight based on the total weight of the (meth)acrylate-based resin.

10. The resin composition for bonding semiconductors according to claim 9,
wherein an amount of the (meth)acrylate-based functional group containing an aromatic functional group is 3% by weight to 30% by weight.

11. The resin composition for bonding semiconductors according to claim 1,
wherein the heat dissipation filler includes at least one selected from alumina, boron nitride, aluminum nitride, silicon carbide, magnesium oxide, zinc oxide, silica, aluminum hydroxide, calcium carbonate, magnesium hydroxide, aluminum oxide, and talc.

12. The resin composition for bonding semiconductors according to claim 1,
wherein the heat dissipating filler includes a reaction product between the heat dissipation filler and a silane-based compound represented by Chemical Formula 3,

[Chemical formula 3]

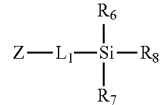

wherein, in the Chemical Formula 3,
Z is an aryl having 6 to 30 carbon atoms, (meth)acryloyloxy, an alkenyl having 2 to 40 carbon atoms, an alkenylaryl having 8 to 40 carbon atoms, or an alkyl having 1 to 20 carbon atoms,
$L_1$ is a direct bond, an alkylene having 1 to 20 carbon atoms, an alkyleneoxy having 1 to 20 carbon atoms, or an alkyleneoxyalkylene having 1 to 20 carbon atoms,
at least one of $R_6$, $R_7$ and $R_8$ is an alkoxy having 1 to 20 carbon atoms, or a hydroxyl group, and
the remainings are the same as or different from each other, and are each independently hydrogen, an alkyl having 1 to 20 carbon atoms, an alkoxy having 1 to 20 carbon atoms or a hydroxy group.

13. An adhesive film for semiconductor comprising:
a polymer substrate containing a (meth)acrylate-based resin, a curing agent and an epoxy resin;
a heat dissipation filler surface-treated with a functional group represented by Chemical Formula 1;
a coupling agent; and
a curing catalyst containing an imidazole-based compound and an organic acid compound,
wherein the heat dissipation filler and the curing catalyst are dispersed in the polymer substrate,

[Chemical Formula 1]

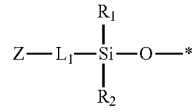

wherein, in the Chemical Formula 1,
Z is an aryl having 6 to 30 carbon atoms, epoxy, (meth)acryloyloxy, an alkenyl having 2 to 40 carbon atoms, an alkenylaryl having 8 to 40 carbon atoms, or an alkyl having 1 to 20 carbon atoms,
$L_1$ is a direct bond, an alkylene having 1 to 20 carbon atoms, an alkyleneoxy having 1 to 20 carbon atoms, or an alkyleneoxyalkylene having 1 to 20 carbon atoms, and
$R_1$ and R2 are the same as or different from each other, and are each independently hydrogen, an alkyl having 1 to 20 carbon atoms, an alkoxy having 1 to 20 carbon atoms, a hydroxy group, a direct bond, or oxy, when R1 or R2 is a direct bond or oxy, the R1 or R2 form a bond with the heat dissipation filler, or form a bond with the adjacent functional group represented by Chemical Formula 1.

14. A dicing die bonding film comprising:
a substrate film;
a tacky layer formed on the substrate film; and
an adhesive layer formed on the tacky layer and including the adhesive film for a semiconductor of claim 13.

15. A method for dicing a semiconductor wafer including the steps of:
performing pre-treating for a complete cutting or a partial treating to enable cutting of a semiconductor wafer including the dicing die bonding film of claim 14 and a wafer laminated on at least one side of the dicing die bonding film; and
irradiating ultraviolet light to the substrate film of the pre-treated semiconductor wafer and picking up individual chips separated by the cutting of the semiconductor.

16. The resin composition for bonding semiconductors according to claim 12, wherein the silane-based compound represented by the Chemical Formula 3 includes at least one selected from trimethoxy[(3-phenyl)propyl]silane, trimethoxy[(3-oxiran-2-yl)propyl]silane, 3-(Methacryloyloxy)propyl]trimethoxysilane, 3-acryloyloxy propyltrimethoysilane, trimethoxy(vinyl)silane, p-styryltrimethoxysilane, and hexyltrimethoxysilane.

* * * * *